(12) United States Patent
Wright et al.

(10) Patent No.: US 10,826,207 B2
(45) Date of Patent: *Nov. 3, 2020

(54) ELECTRICAL CONNECTOR FOR CONNECTING ELECTRICAL CONDUCTORS TO A PRINTED CIRCUIT BOARD

(71) Applicant: Weidmüller Interface GmbH & Co. KG, Detmold (DE)

(72) Inventors: Stephan Wright, Detmold (DE); Jürgen Ude, Detmold (DE); Andreas Muhs, Borgentreich (DE); Volker Schröder, Lemgo (DE); Sascha Nolte, Bad Driburg (DE)

(73) Assignee: Weidmüller Interface GmbH & Co. KG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/658,277

(22) Filed: Oct. 21, 2019

(65) Prior Publication Data
US 2020/0127395 A1    Apr. 23, 2020

(30) Foreign Application Priority Data
Oct. 22, 2018   (DE) .................. 10 2018 126 148

(51) Int. Cl.
*H01R 12/70*   (2011.01)
*H01R 12/57*   (2011.01)
(Continued)

(52) U.S. Cl.
CPC ....... *H01R 12/7011* (2013.01); *H01R 12/515* (2013.01); *H01R 12/57* (2013.01);
(Continued)

(58) Field of Classification Search
CPC ................................................ H01R 12/7011
See application file for complete search history.

(56) References Cited

U.S. PATENT DOCUMENTS

| | | | | |
|---|---|---|---|---|
| 4,477,142 A | * | 10/1984 | Cooper | H01R 12/58 439/567 |
| 4,547,835 A | * | 10/1985 | Pansaerts | E05B 65/46 361/759 |
| 4,629,278 A | * | 12/1986 | Norton | H05K 3/341 29/842 |
| 5,586,008 A | * | 12/1996 | Kozel | H01R 12/7058 174/260 |

(Continued)

FOREIGN PATENT DOCUMENTS

| DE | 102011011017 A1 | 8/2012 |
|---|---|---|
| DE | 202009018730 U1 | 11/2012 |
| DE | 202016105358 U1 | 1/2018 |

*Primary Examiner* — James Harvey
(74) *Attorney, Agent, or Firm* — Laubscher & Laubscher, P.C.

(57) ABSTRACT

An electrical connector includes a housing which can be electrically connected on a connection side to an electrical connection part. On a contact side, one or more contacts are provided to electrically contact one or more counter-contacts of a printed circuit board. At least one latching peg assembly including two functional elements passes through an opening of the printed circuit board and can be moved by an actuation element from a non-expanded released position into an expanded latched position in which its diameter on the side of the opening which faces away from the housing is greater than the diameter of the opening of the printed circuit board. One of the functional elements is arranged on the actuation device and another element is arranged on a component of the connector which is movable relative to the actuation device.

15 Claims, 13 Drawing Sheets

(51) Int. Cl.
  *H01R 12/58*  (2011.01)
  *H01R 13/74*  (2006.01)
  *H01R 12/51*  (2011.01)
  *H05K 7/02*  (2006.01)
  *H01R 12/72*  (2011.01)
  *H05K 1/14*  (2006.01)
  *H01R 13/66*  (2006.01)

(52) U.S. Cl.
  CPC ......... *H01R 12/58* (2013.01); *H01R 12/7082* (2013.01); *H01R 12/722* (2013.01); *H01R 13/6658* (2013.01); *H01R 13/74* (2013.01); *H05K 1/14* (2013.01); *H05K 7/02* (2013.01)

(56) References Cited

U.S. PATENT DOCUMENTS

| | | | | |
|---|---|---|---|---|
| 5,697,812 A * | 12/1997 | Sampson | ........... | H01R 12/7023 |
| | | | | 439/557 |
| 5,800,209 A * | 9/1998 | Suzuki | ............... | H01R 12/7047 |
| | | | | 439/571 |
| 5,980,314 A * | 11/1999 | Roberts | ............. | H01R 12/7023 |
| | | | | 439/567 |
| 2005/0054242 A1* | 3/2005 | Hsieh | ................ | H01R 12/7011 |
| | | | | 439/660 |
| 2010/0279523 A1* | 11/2010 | Schwettmann | ...... | H01R 12/585 |
| | | | | 439/81 |
| 2018/0123266 A1* | 5/2018 | Endo | ...................... | H01R 12/51 |
| 2020/0127395 A1* | 4/2020 | Wright | ................... | H01R 13/74 |
| 2020/0127396 A1* | 4/2020 | Wright | ............... | H01R 12/7082 |
| 2020/0127407 A1* | 4/2020 | Wright | ............... | H01R 13/2407 |

\* cited by examiner

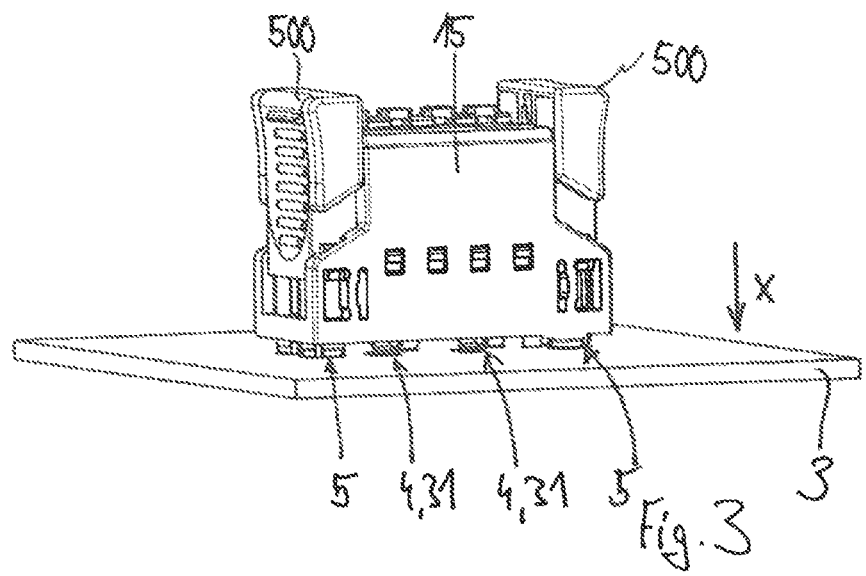

FIG. 4a
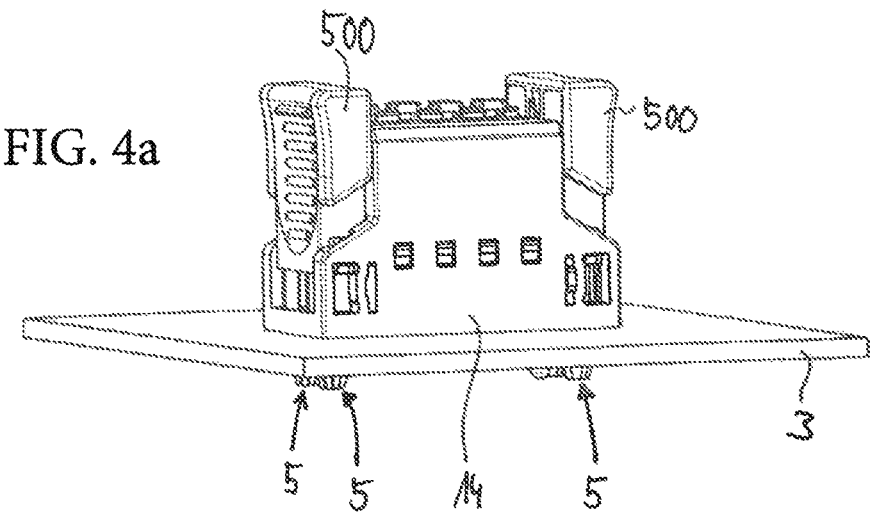
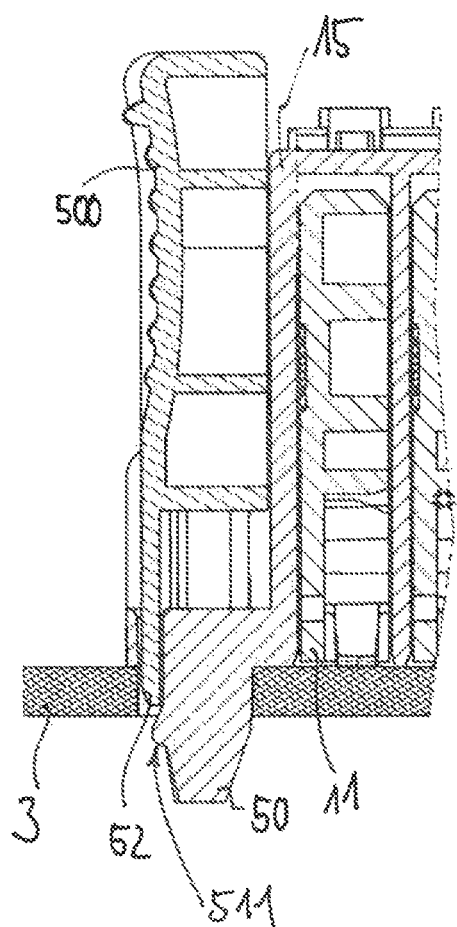
FIG. 4b

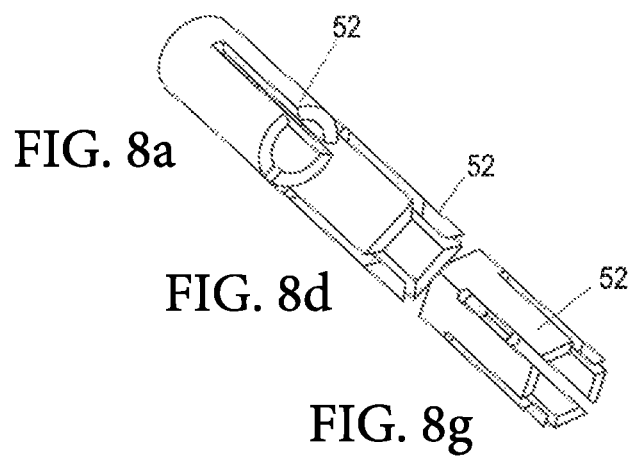
FIG. 8a
FIG. 8d
FIG. 8g
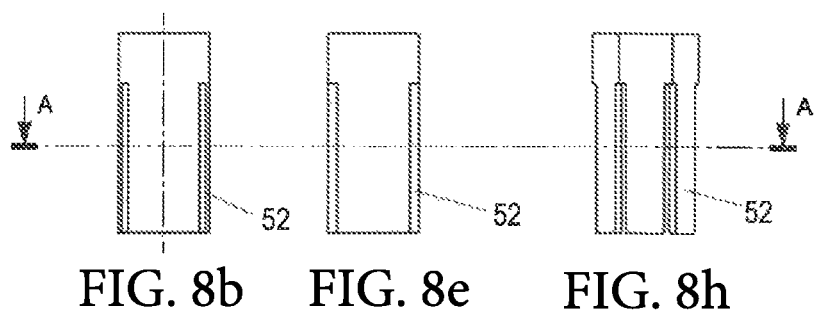
FIG. 8b  FIG. 8e  FIG. 8h
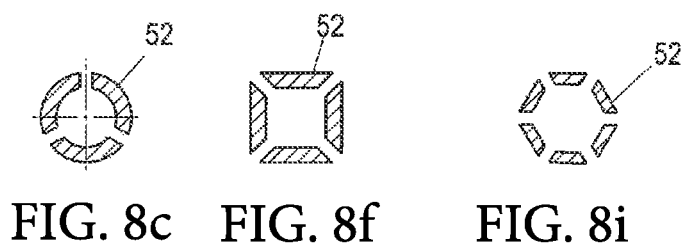
FIG. 8c  FIG. 8f  FIG. 8i

ELECTRICAL CONNECTOR FOR CONNECTING ELECTRICAL CONDUCTORS TO A PRINTED CIRCUIT BOARD

This application claims priority of DE 10 2018126148.9 filed Oct. 22, 2018, the entire contents of which are incorporated herein by reference.

BACKGROUND OF THE INVENTION

The present invention relates to an electrical connector for connecting electrical conductors to a printed circuit board and to a method for connecting and fastening such an electrical connector to a printed circuit board.

In order to connect one or more electrical conductors or multi-core cables to electric printed circuit boards, connection plugs—hereafter referred to as connectors—are used, on which one or multiple conductors can be connected. For each conductor one contact is provided for contacting a counter-contact of the printed circuit board. The contacts of the connection plug are arranged in or on a single-part or multi-part housing which can be fastened on the printed circuit board. In order to implement this in terms of construction, corresponding fastening and counter-fastening devices are formed on the housing or on the printed circuit board. It is known to form the fastening devices as expanding pegs which can be moved substantially perpendicularly to the surface and which, when the housing is placed on the printed circuit board, are designed to pass through a bore or a passage hole of the printed circuit board as counter-fastening devices. The expanding pegs, when introduced into these bores, are first compressed until they relax again or broaden when the final installation position is reached, whereby the housing can be secured to the printed circuit board.

This method of fastening the connector on the printed circuit board has proven itself. However, there is a need for improvement by being able to release the latching pegs and thus the housing and the entire connector from the printed circuit board. In addition, it is desirable to design the entire actuation process, that is the latching or fastening and the unlatching or releasing of the connector in such a manner that the connector can be latched relatively simply by hand, without great effort on the printed circuit board and also be unlatched again or released from the latching position.

SUMMARY OF THE INVENTION

An electrical connector is provided for electrically connecting an electrical connection part, for example, an electrical conductor or plug, to a printed circuit board. The connector includes a housing which can be electrically connected on a connection side of the electrical connector to an electrical connection part and which includes on a contact side of the electrical connector one or more contacts to electrically contact one or more counter-contacts of the printed circuit board. At least one latching peg passes through an opening of the printed circuit board and can be moved from a non-expanded release position into an expanded latching position in which its diameter on the side of the opening which faces away from the housing is greater than the diameter of the opening of the printed circuit board. Accordingly, the latching peg cannot be pulled off non-destructively from the printed circuit board from the side of the housing. The housing includes at least one actuation device which is movable relative to the housing. The latching peg includes at least two functional elements which are movable relative to one another, of which at least one is arranged on the actuation device and of which at least another one is arranged on a component of the connector, which is movable relative to the actuation device. The counter-contacts are designed as contacts on the surface of the printed circuit board.

In this way it is possible to temporarily successively separate contacting and latching so that it is possible to perform locking or fastening and the unlatching or release from the connector in such a manner that the connector can be latched relatively simply and without effort by hand on the printed circuit board and also be unlatched again or released from the latching position. In particular, it is also possible to use the latching arrangement multiple times, so that it can also be released again from its latching position without any problems.

According to a preferred embodiment, the at least one other of the at least two functional elements which are movable relative to one another, is arranged on the housing as part of the connector which is movable relative to the actuation device. Thus, the other of the at least two functional elements which are movable relative to one another is fastened directly on the housing or on an additional actuator which is then movable relative to the actuation element and the housing, but which is also arranged indirectly on the housing. The term printed circuit board should not be interpreted narrowly. It covers a variety of types of boards on which at least one contact, conductor track and/or electric or electronic components are arranged.

Furthermore, it is preferable that the contacts are formed as compression spring contacts wherein the counter-contacts are formed as contacts on the surface of the printed circuit board. The contacts are formed as metal surfaces such as solder pads or the like. In combination with the latching peg, contacting and fastening of the connector on the printed circuit board can be performed particularly easily and reliably.

Several of the actuation devices can be provided on the housing. Furthermore, the housing and the respective actuation device form two or more of the latching pegs. However, with the actuation of only one actuation element, double or multiple latching can be achieved.

The latching peg assembly includes at least one expanding mandrel and one or more radially outwardly expanding webs which are arranged concentric to the expanding mandrel. With these elements, a particularly reliable and easily handled latching and release of the housing on and from the printed circuit board can be implemented. The expanding webs on the housing and the expanding webs on the actuation device are formed. In this manner it is possible to design the connector in such a manner that the latching webs are deformed to a lesser extent during latching, such that release remains possible.

In terms of construction, this can be implemented in a variety of ways.

In order to establish the latching position, the expanding mandrel has a thickening region which, in the mounted state of the housing on the printed circuit board, lies on the side of the printed circuit board facing away from the housing and on which the expanding webs are moved during latching into their expanded latching position.

The elements of the latching device can be designed in a variety of manners. Thus, the expanding mandrel can have a round, angular, or polygonal cross section, and around the mandrel one or more of the expanding webs can be arranged or distributed on a corresponding circular and/or polygonal contour.

Moreover, the actuation device is formed as a shifting device and the actuation device and the housing include corresponding guides such as pegs and elongate holes which enable easy shifting of the actuation device on the housing in a latching direction X and in a release direction −X.

The latching devices can be combined with the contacts designed as compression spring contacts. However, it is also possible that the contacts are formed in another manner, for example, as pin or blade contacts or as socket contacts.

A method for contacting a printed circuit board is also provided. The connector is placed on the printed circuit board and the contacts of the connector are preferably designed as compression spring contacts. Application of a contact actuation force causes the contacts to contact the counter-contacts of the printed circuit board, and elements of the at least one expanding peg assembly are guided without force through the corresponding opening of the printed circuit board. At least one actuation element is moved on the housing upon application of a latching force into a latching position, wherein the expanding webs are moved outside on the expanding mandrel into their expanding and latching position.

With the connector connected on the printed circuit board, the connection direction and latching direction X extend perpendicularly to the printed circuit board. In this embodiment, the connector can be placed on the printed circuit board.

Such a connector can be connected particularly rapidly to an electrical conductor tab or retrofitted. By fixing the connector to the printed circuit board, the connector is securely positioned on the printed circuit board. Thereby, contact of the connector with the contact surfaces of the printed circuit board is also permanently ensured.

BRIEF DESCRIPTION OF THE FIGURES

Other objects and advantages of the invention will become apparent from a study of the following description when viewed in the light of the accompanying drawing, in which:

FIGS. 2, 3, 4a and 5a are perspective views illustrating the steps for connection of an electrical connector on a printed circuit board, respectively;

FIGS. 4b and 5b are side sectional views illustrating the connection of the connector of FIGS. 4a and 5a on a printed circuit board, respectively;

FIGS. 8a-8i illustrate latching pegs of different designs;

DETAILED DESCRIPTION

Figure 1A:
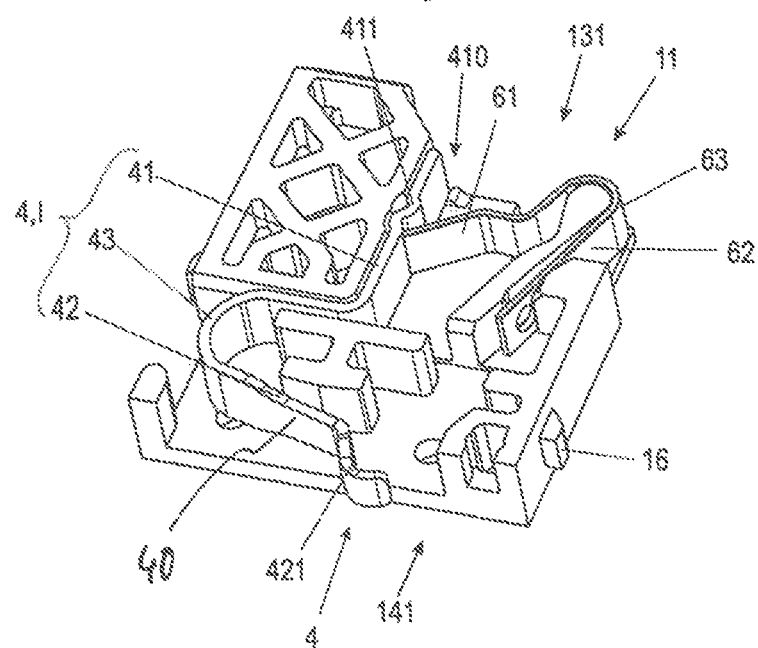
FIGS. 1a-1c are perspective views of a housing portion of an electrical connector according to the invention in various states of assembly, respectively.
Figure 1B:
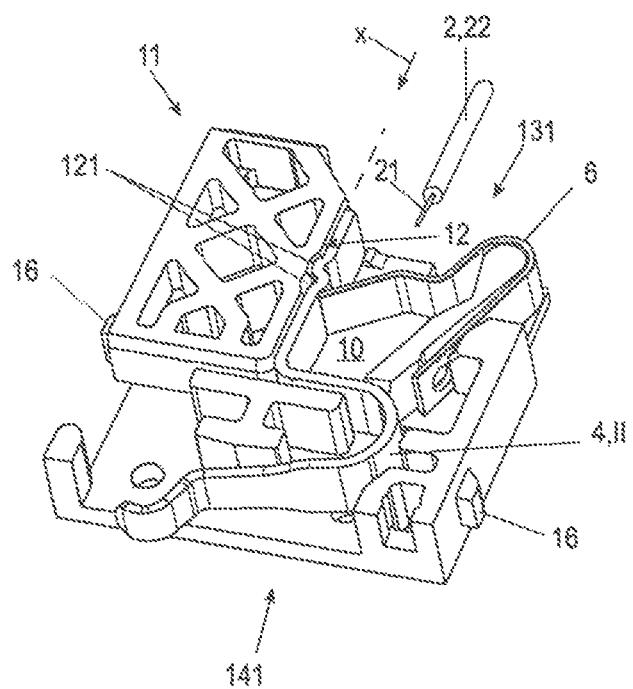
Figure 1C:
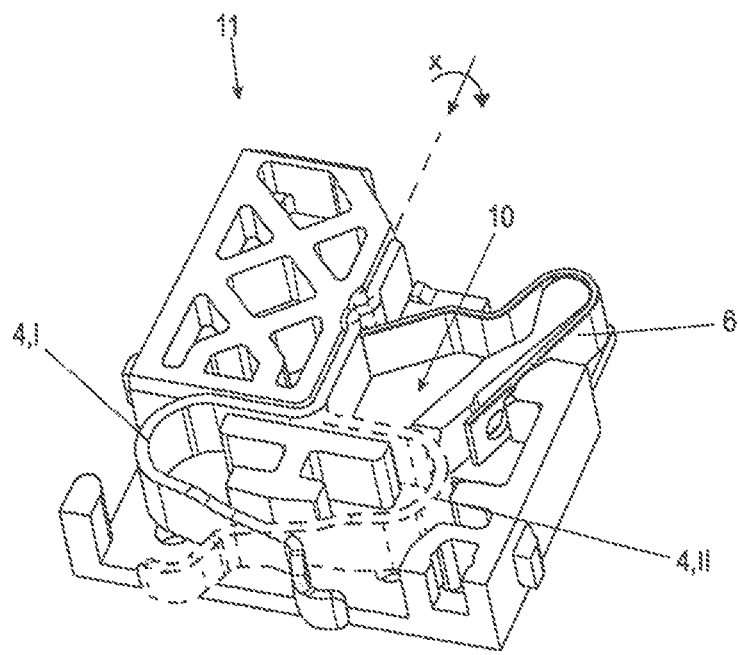

FIGS. 1a-1c show a housing portion 11 of an electrical connector 1 according to the invention. In the housing portion 11, a connection chamber 10 is arranged. The connection chamber 10 is designed for receiving a connector contact 4 which is used to contact a counter-contact—which can be designed, for example, as a solder surface or the like—of a printed circuit board 3.

This contact 4 is formed as a current rail 40. This is advantageous but not necessary in the context of the present invention. The contact 4 could also be formed instead in another manner. It is preferably formed as a compression spring contact which, when the connector 1 is placed on the printed circuit board 3, is tensioned so that it pushes with a force F away from the printed circuit board, against the respective counter-contact. However, it can also be designed as a solder pin or the like.

In a preferred embodiment, the current rail 40 is produced to form a single-piece as a punch-bent component from a material with good conductivity. It extends through the connection chamber 10 from a connection side 131 of the housing portion 11 to a contact side 141 of the housing portion 11. The connection side 131 and the contact side 141 are arranged opposite one another. However, the invention also extends to connectors 1 in which the connection side 131 and the contact side 141 are arranged to form an angle (not shown) with respect to one another, in particular at a right angle or adjacent to one another.

On the connection side 131, an electric connection member 2 can be electrically connected directly to the current rail 40. On a contact side 141, the current rail 40 can be electrically contacted with a printed circuit board 3.

For this purpose, the current rail 40 includes a connection arm 41 for the connection with the electric connection member 2 as well as a contact arm 42 for the connection to the printed circuit board 3. The connection arm 41 and the contact arm 42 are connected to one another by a connecting arm 43.

The connection arm 41 extends in a connection and mounting direction X. It lies at least partially flat on an inner wall 12 of the housing portion 11. On the connection arm 41 of the current rail 40, a holding device 411 is provided, which engages into a recess 121 of the inner wall 12. With the holding device 411, the current rail 40 is positioned in a defined manner on the inner wall 12. The holding device 411 has a wave-shaped design. Thereby, the holding device 411 can at the same time be used as an abutment for a clamping leg 61 of a clamping spring 6. Preferably, instead of a wave-shaped design, a rounded, angular or zigzag design of the holding device 411 is provided. The recess 121 is designed correspondingly with the holding device 411, so that the holding device 411 fits into the recess 121.

On the connection side 131, the connection arm 41 is formed as clamping contact 410, in particular as a spring contact of the push-in type. For this purpose, a clamping spring 6 is provided which is secured with a holding leg 62 in the connection chamber 10. The clamping spring 6 includes a clamping leg 61 which is provided for clamping the connection member 2 in the connection chamber 10. The clamping leg 61 and the holding leg 62 are connected to one another by a connecting bow 63. The clamping spring 6 is produced from spring steel to form a single piece. When the connection member 2 is inserted, the clamping leg 61 is pivoted against a resetting force into the connection chamber 10 until the connection member 2 can slide between the current rail 40 and the clamping leg 61. The clamping leg 61 is then pivoted back with the resetting force and clamps the connection member 2 on the current rail 4.

FIG. 1b shows, as an example, an electrical conductor as connection member 2. However, instead of an electrical conductor as the connection member 2, a plug or an electrically conducting rod is also preferable. The electrical conductor 2 includes an electrically conductive core 21 as well as an electrically insulating sheathing 22. On one end it is insulated so that the sheathing 22 is removed and the core 21 is exposed. Represented is the connection of the electrical conductor 2 to the clamping contact 410 of the connector 1 by introducing the insulated end of the conductor 2 in connection direction X between the current rail 40 and the clamping leg 61. Here, the connection direction X extends parallel to one or in a first extension direction X of the connector 1.

The contact arm 42 is designed to be resilient. In a connection state of the connector 1 to the printed circuit board 3 in which the connector 1 is placed on the printed circuit board 3, pressed on and latched on the printed circuit board, the contact arm 42 is designed to be pressed onto the printed circuit board 3. In the connection state of the connector 1 on the printed circuit board 3, the connection direction X therefore extends perpendicularly thereto.

In order to form the contact arm 42 so that it is resilient, the connecting arm 43 extends transversely to the connection arm 41. In addition, the connecting arm 43 has a bow. Thereby, the connecting arm 43 and the contact arm 42 are arranged in a U-shaped configuration.

During placement onto the printed circuit board 3, the contact arm 42 can be pressed against the resistance force toward the connection arm 41, so that its free end is pressed in the connection state with the resistance force onto the printed circuit board 3. Subsequently, the connector 1 can be fastened with one or more latching pegs, which are described in further detail below, to the printed circuit board 3 so that the connector 1 can no longer be released automatically from its position.

The spring force of the contact arm is designed to provide good contact. The contact arm 42 on its open end has a contact portion 421 which is designed in the form of a bow and provided for contacting the printed circuit board 3. As a result of the bow shape, the contact surface 31 of the printed circuit board 3 is not damaged when the contact portion 421 is pressed on.

However, the U-shaped arrangement of the contact and of the connecting arm 42, 43 produces a tilting torque onto the connector 1, wherein tilting of the connector 1 at first prevents latching of the connector 1 on the printed circuit board 3.

Furthermore, in order to compensate for the tilting moment as much as possible and in order to prevent tilting of the connector 1 from the start, the current rail 40 can be positioned in two positions I, II in the connection chamber 10 of the housing portion 11. FIG. 1a shows the connector 1 with the current rail 4 arranged in the first position I, FIG. 1b shows the connector 1 with the current rail 4 arranged in the second position II, and in FIG. 1c, the current rail 40 is represented with solid lines in the first position I and with dashed lines in the second position II in the connection chamber 10 of the connector 1.

The current rail 40, in the first position I, is rotated with respect to the second position II by 180° in a rotation direction 55 around the connection direction X. As a result, the contact arm 42 extends in the first position I against a second extension direction of the connector 1, which extends transversely to the first extension direction X of the connector 1, and therefore also transversely to the connection direction X. In the second position II, the contact arm 42 extends in the second extension direction 52 of the connector 1. The tilting torque brought about by the resetting force of the contact arm 42 when the connector 1 is pressed onto the printed circuit board 3 therefore acts in these two positions I, II in opposite directions.

As a result of adjacent positioning of two or more such housing portions 11 in a third extension direction which is arranged transverse to the first extension direction X and transverse to the second extension direction using current rails 4 which are arranged alternatively in the first position I and in the second position II, a connector 1 can be produced for connecting two or more connection parts 2 to the printed circuit board 3, wherein the tilting torques are compensated. In the case of an even number of housing portions 11, a connector 1 produced in this manner has no tendency to tilt.

In order to fasten the housing portions 11 next to one another, they are arranged in an outer casing 15.

The present invention is also suitable for connectors 1 wherein the contacts 4 for contacting the printed circuit board 3 are arranged directly in a housing which can comprise one or more chambers for receiving the contacts 4. The housing portion 11 is then omitted.

In addition, the invention is also suitable for a connector 1 wherein only a single contact 4 for contacting the printed circuit board 3 is provided. The connector can either be inserted directly in a housing, so that it is fastened to the printed circuit board 3, or it can be inserted in a housing portion 1 which is inserted in an outer casing 15 as shown in FIGS. 1a, 4a and 4b.

The terms housing and outer casing are used synonymously and always with reference numeral 15. To the extent that the terms contact 4 and counter-contact are used, this should not be understood in the sense of the number "one" in a limiting manner, but always applies also to a plurality of contacts 4 and counter-contacts 31.

The housing 15 is with the printed circuit board 3 with one or more latching peg assemblies 5. To the extent that reference is made to a latching peg assembly 5, "a" should not be understood in a limiting manner in the sense of the number one, instead it should be understood to also refer to a plurality of latching peg assemblies 5.

With the connector 1 mounted on the printed circuit board in which the contact 4 contacts the counter-contact 31 of the printed circuit board 3, the respective latching peg assembly 5 passes through a corresponding opening such as a passage hole 32 of the printed circuit board 3 and, on the side of the printed circuit board 3 which faces away from the housing 15, it protrudes from the opening 32 across the printed circuit board. The latching assembly is radially expanded sufficiently to fix the housing 15 and thus the connector 1 to the printed circuit board 3.

The latching peg assembly 5 includes multiple functional elements which are movable relative to one another.

The latching peg assembly includes two elements which are movable relative to one another. However, it can also include more than two elements which are movable relative to one another.

These elements include an expanding mandrel 50 and one or more expanding webs 52 arranged concentrically relative to the expanding mandrel 50.

The centrally arranged expanding mandrel 50 can have a round, angular, or polygonal design.

The expanding mandrel 50 has a constant cross section along its length in direction X as shown in FIGS. 2-5. However, the cross section can also change over the length in direction X, for example, it can increase in sections as shown in FIGS. 9 to 12.

Concentrically thereto or around the expanding mandrel 50, one or more of the expanding webs 52 are arranged circumferentially or distributed over the circumference. In a polygonal design, it is possible to arrange one of the expanding webs 52 on the lines of an imaginary additional polygon on each side of the polygon. FIGS. 8a-8c illustrate these arrangements. Polygonal arrangements in the manner of FIGS. 8b and 8c and in addition, similar polygonal arrangements, are also understood to be concentric.

The expanding webs 52 preferably have a constant cross section over their length as shown in FIGS. 2-5. However, this is not necessarily the case. For example, they can also be shaped in the manner of a wedge as shown in FIGS. 9 to 12.

In a latching state, the entire diameter of the latching peg arrangement 5 including the respective radially mutually complementary elements 50, 52 has to be greater in a circumferential direction than the diameter of the opening 32 of the printed circuit board 3 in such a manner that self-locking locking of the housing 15 is achieved on the printed circuit board 3 which also receives the contact forces as in a counter-bearing.

The expanding mandrel 50 is movable relative to the expanding webs 52. The expanding mandrel 50 is formed on an actuation device 500 which is movable relative to the housing 15 as shown in FIGS. 9-12. However, the expanding mandrel 50 can be arranged on the housing with the expanding webs 52 formed so that they are movable relative to the housing 15 on the actuation device 500 as shown in FIGS. 2-5.

The housing 15 and the actuation device 500 are designed to be movable relative to one another.

To that extent, the actuation device 500 forms a slider and the actuation device 500 and the housing 15 include corresponding guides such as pegs 55 and elongate holes 56 which allow and assist in a guiding manner a shifting of the actuation device 500 on the housing 15 in a latching direction X and in a release direction −X. In addition, the actuation device 500 can be guided in a groove of the housing.

Below, a connection of the connector on a printed circuit board 3 is described in reference to FIGS. 2 to 5.

Figure 2:
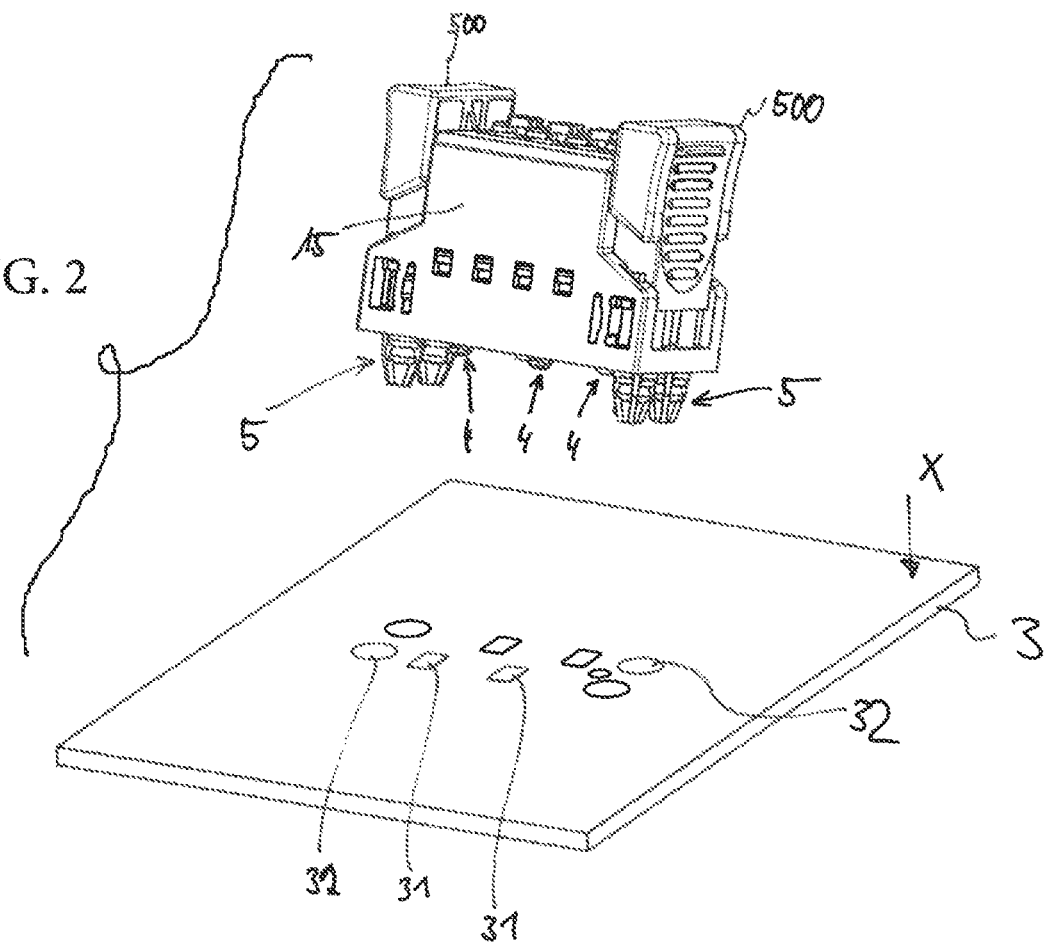

When the connector 1 is placed in a direction X which is perpendicular or substantially perpendicular to the printed circuit board 3 as shown in FIGS. 2 and 3, the contacts 4 formed as compression spring contacts are at first compressed. The housing 15 of the connector 1 is preferably placed on the printed circuit board 3 as shown in FIG. 4.

When the connector 1 is placed on the circuit board, the actuation device 500 is in an upper position in which it has been shifted on the housing 15 beforehand, upward or against the shifting direction X.

When the connector 1 is placed on the printed circuit board 3 in the respective opening 32 of the printed circuit board 3, the respective expanding mandrel 50 which is formed according to FIG. 2 to 5 on or integral with the housing 15 is introduced. After the housing 15 has been completely positioned, it protrudes from the respective opening 32 on the side of the printed circuit board 3 facing away from the housing 15.

If the diameter of the expanding mandrel 50 is smaller than the maximum diameter of the opening 32 of the printed circuit board 3 for passage through the respective opening 32, little or no force is necessary. The expanding webs 52, which can be formed as a single piece on the actuation device 500, can be introduced into the opening 32 which facilitates further actuation. The expanding mandrel 50 lies in the center between the upper expanding elements 52.

The actuation device 500 is now actuated which means that it is shifted in the mounting direction and placement direction X relative to the housing 15 on the housing 15 as shown in FIG. 4. An actuation surface is formed on the actuation device 500. The actuation surface is fluted.

Figure 5A:
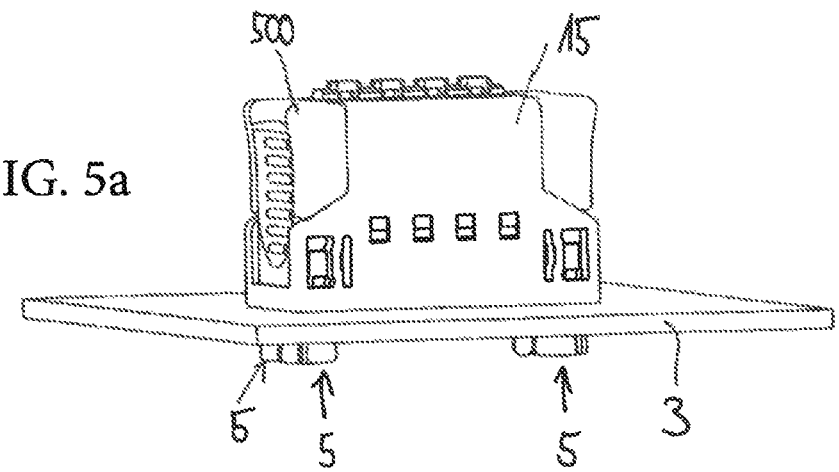
Figure 5B:
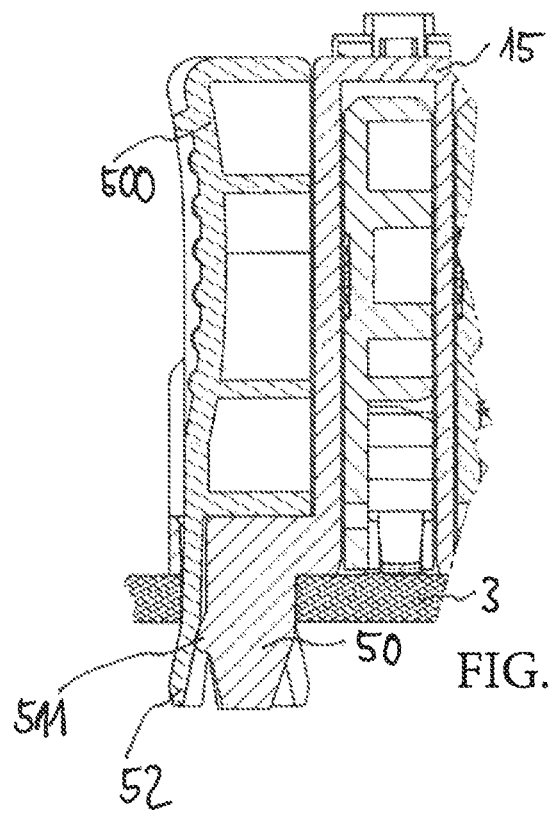

The expanding mandrel 50 has one or more circumferential radial thickened sections 511 extending perpendicularly to the shifting direction as shown in FIGS. 4b and 5b. The thickened sections preferably extend axially up to the area under the lower margin of the printed circuit board 3. They can be formed as a cone/bevel, on which the expanding webs 52, as they are lowered by the actuation device 500 and after they come out of the opening 32, are guided at a slant radially outwardly in an expanding manner.

When the actuation device 500 is moved from an upper position into a lower position with respect to the position of the printed circuit board 3 relative to the housing 15, the expanding webs 52 move in the placement direction X. The expanding webs 52 are dimensioned in such a manner that they can slide past the thickened sections 511 of the expanding mandrel 50. In this region, the added radial total extent, or the total diameter of the expanding peg assembly 5 including the expanding mandrel 50 and the radius of the imaginary circle or of the imaginary polygon of the expanding web 52, is greater—preferably at least 10% greater—than the diameter of the opening 32 of the printed circuit board. The expanding mandrel 50 is braced inwardly against the expanding webs 52. As a result, the expanding webs 52 slide on the expanding mandrel 50 and are forced into an expanded position, the end position of which is represented in FIG. 5.

In addition, one or more expanding webs 52 can be provided or distributed around the respective expanding mandrel 50. The expanding webs can also be referred to as a kind of expanding rivet.

It is only during the expansion into the final latching position of FIG. 5 that a slightly higher application force is necessary in order to achieve the expansion of the expanding webs 52 on the expanding mandrel 50. The advantage is that the compression spring contacts are at first compressed and that it is only after the compression of the contacts 4 that actual latching occurs so that overall, an operation which can easily be implemented by the operator is enabled. The latching webs 52 undergo very little plastic deformation. Therefore, it is possible to release the latch again and to use the connector 1 multiple times.

The latching peg assembly 5 is moved into a latching position which is designed to be self-locking in such a manner that in the region of this latching device 15, the housing 15 cannot be removed from the printed circuit board 3 without the actuation device 500 on the housing 15 being moved again from the lower latching position into the upper release position.

During subsequent release of the connector 1, the actuation device 500 is moved back from the lower position into the upper position. The expanding webs 52 are moved again into the upper position which releases the latch before the action of the compression springs of the contacts is overcome at which point the connector 1 can again be removed from the printed circuit board 3.

It is also possible to provide more than one of the latching peg assemblies 5 on a single actuation device 500. Movement of a respective actuation device 500 provides multiple latches. This is possible using an optimal latching method in which the force/path courses have been optimized so that, in spite of manual operation, twofold or multiple latching on an individual actuation device 500 can be implemented.

Figure 6A:
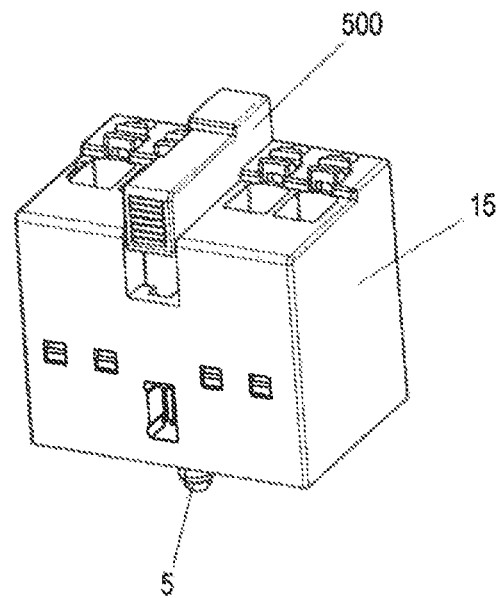
FIGS. 6a and 6b are top and bottom perspective views, respectively of a second embodiment of a connector according to the invention.
Figure 6B:
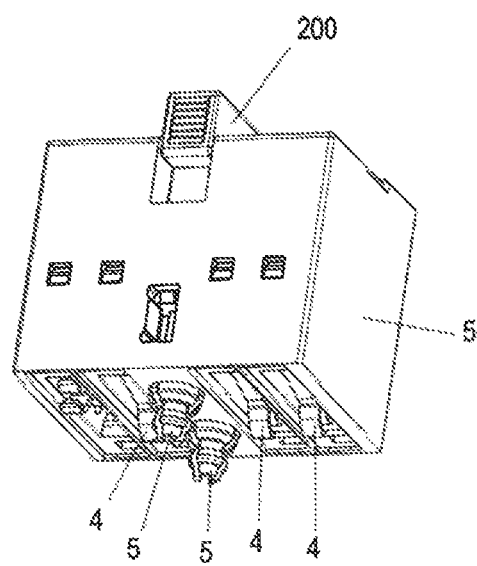
Figure 7A:
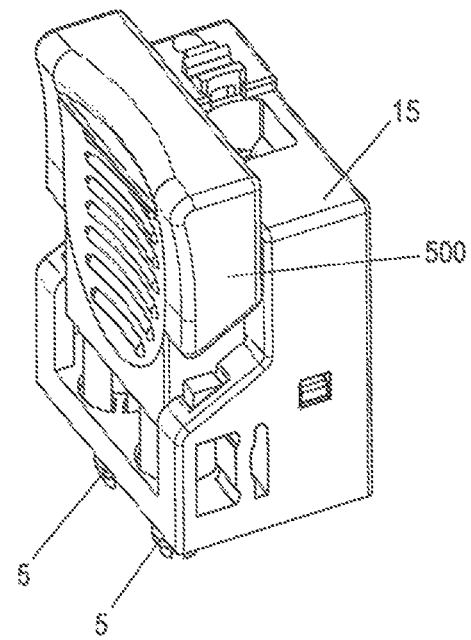
FIGS. 7a and 7b are top and front perspective views, respectively of a third embodiment of a connector according to the invention.
Figure 7B:
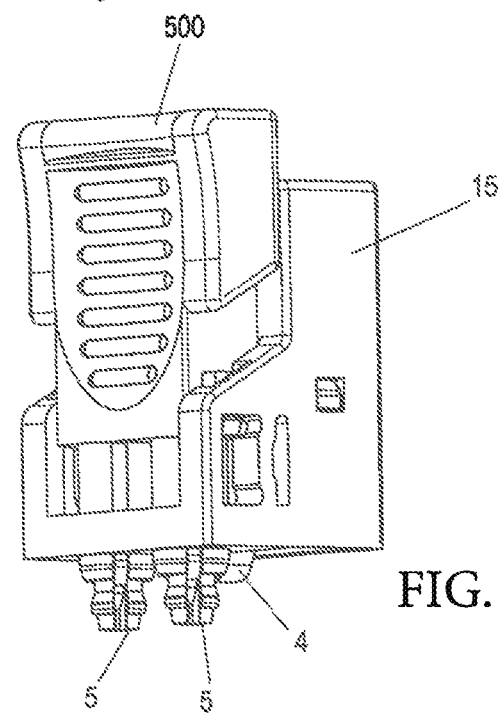

On the one hand, it is possible to arrange only a single actuation device 500 with one more latching peg assemblies 5 on a connector housing 15. FIGS. 6 and 7 show such solutions. According to FIG. 7, the actuation device 500 with one or more latching peg assemblies 5 is arranged laterally next to an individual contact 4 on the housing 15.

On the other hand, according to FIG. 6, the one actuation device 500 is arranged with one or more latching peg assemblies 5 in a row between the contacts 4. In such a manner, central latching is implemented.

It is also possible to provide two or more actuation devices 500 on a single housing 15 of a connector 1. Each actuation device has a single or multiple latching peg assemblies 5. FIGS. 2 to 5 and 9 to 12 show such solutions. In particular, on two ends of the housing 15, one of the actuation devices 500 with the one or the multiple latching peg assemblies 5 can be arranged in each case. In such a manner, a particularly reliable latching and a particularly simple handling during contacting and latching as well as during the release of the connector 1 are ensured.

With regard to design and function, the embodiment of FIGS. 9 to 12 largely corresponds to the design of the embodiment of FIGS. 2 to 5.

Figure 9:
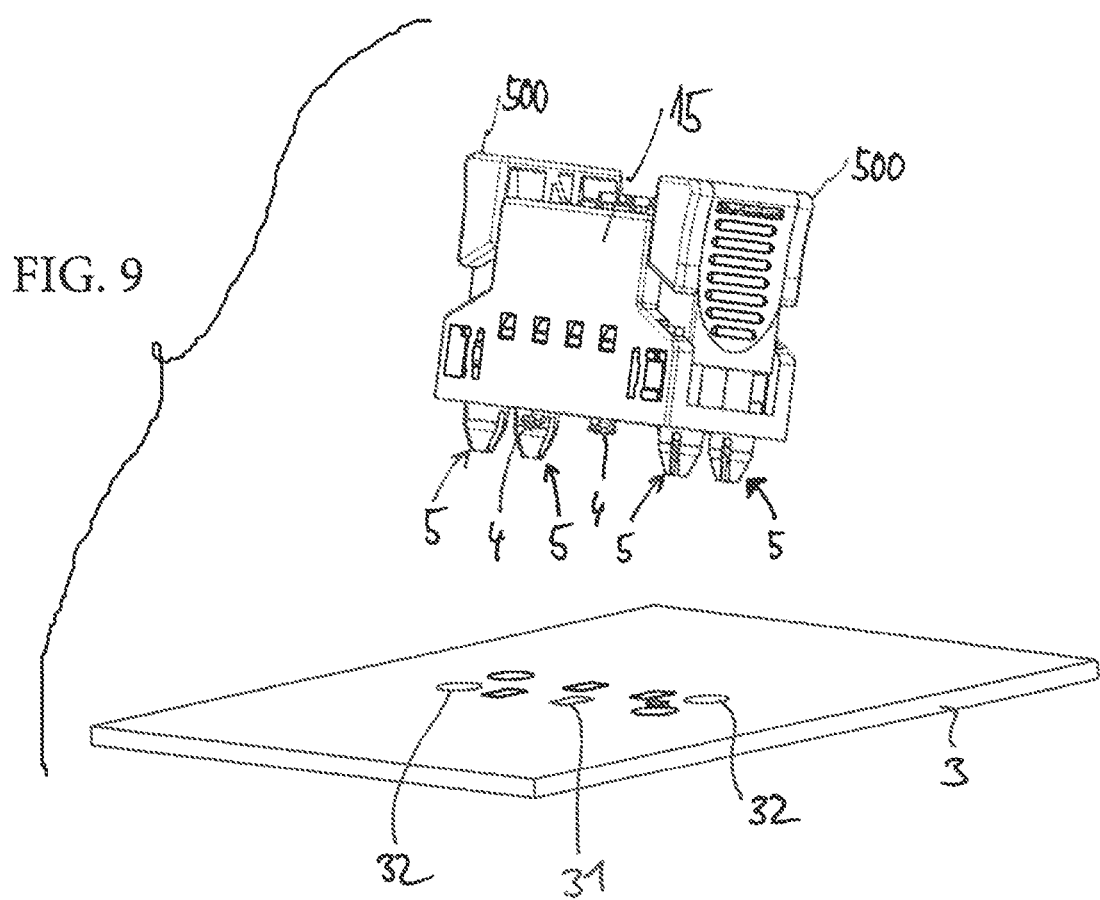
FIGS. 9, 10, 11a and 12a are perspective views illustrating the steps for connection of a fourth embodiment of an electrical connector on a printed circuit board, respectively.
Figure 10:
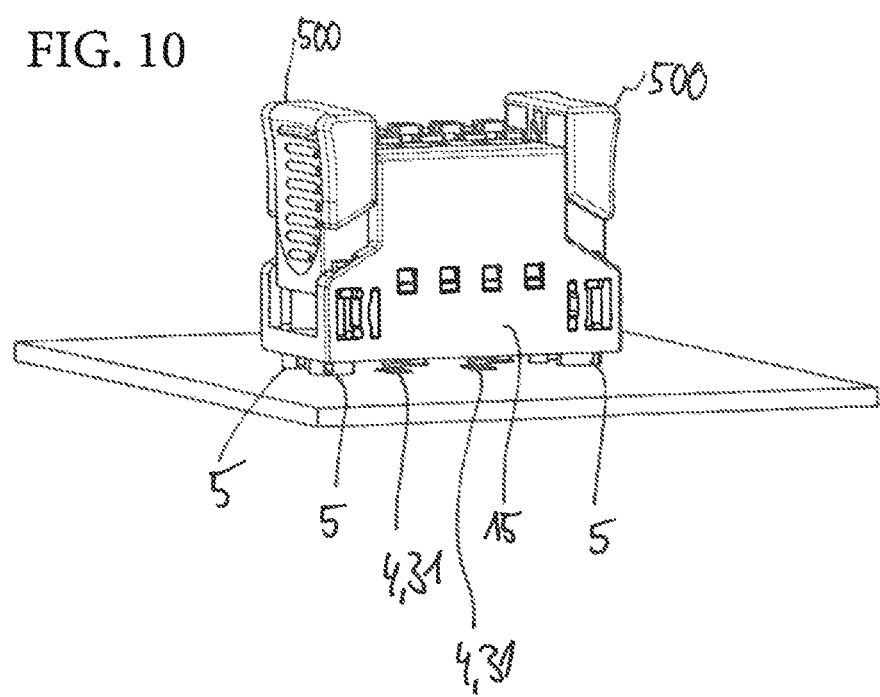
Figure 11A:
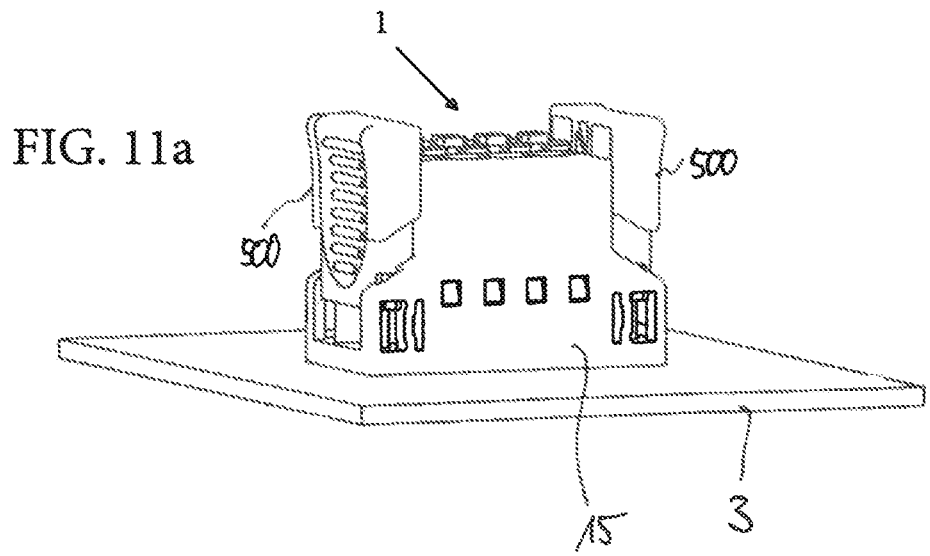
Figure 11B:
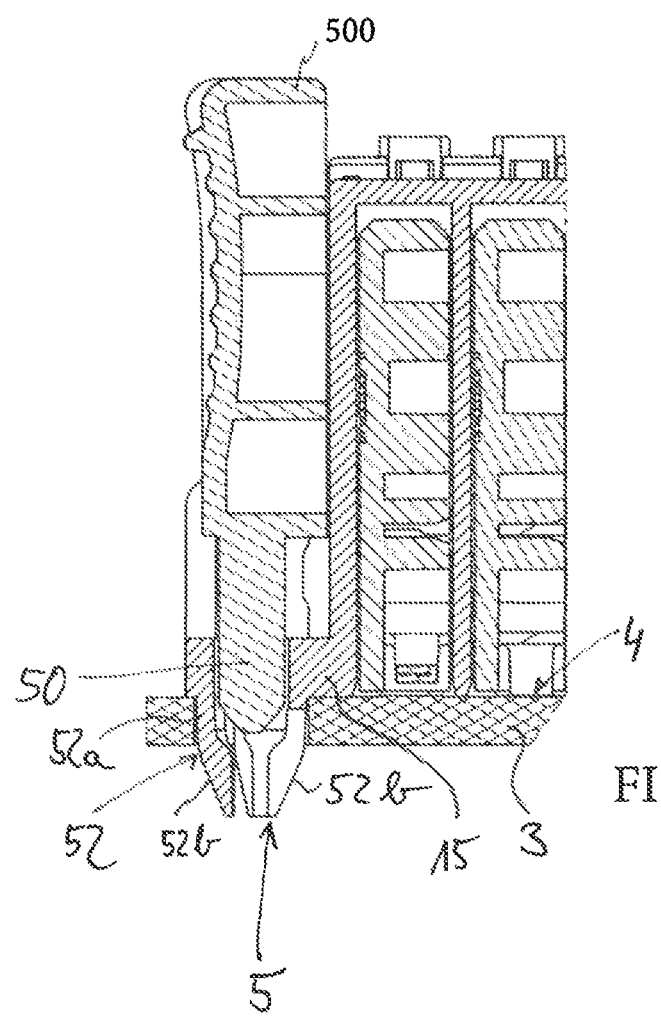
FIGS. 11b and 12b are side sectional views illustrating the connection of the connector of FIGS. 11a and 12a on a printed circuit board, respectively.
Figure 12A:
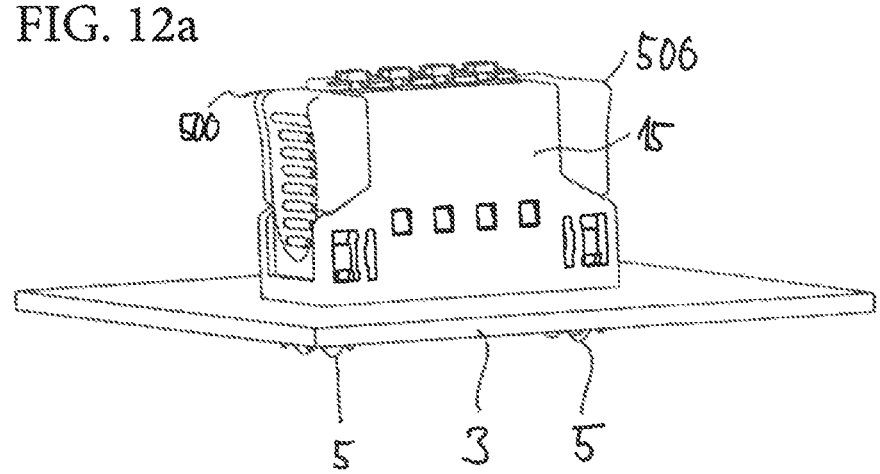
Figure 12B:
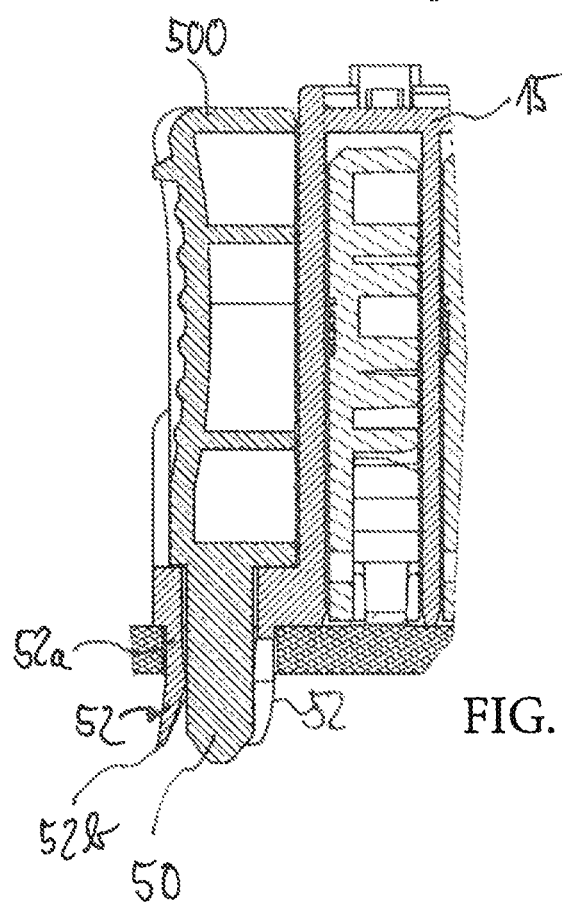

However, with regard to the design of the actuation devices 500 and of the latching peg assemblies 5, a number of differences exist:

According to FIG. 9, the actuation mandrel 50 is provided on the actuation element 500. The expanding webs 52, on the other hand, are formed on the housing 15.

According to FIG. 9, the actuation mandrel 50 has a constant diameter in the region in which it passes through the respective opening 32 and protrudes from it. It is only at its free end that it has a tip configured for insertion into an opening on the circuit board.

When the connector 1 is placed on the printed circuit board 3 after contact has occurred, the actuation device 500 is again in its upper position. The expanding mandrel is either not yet axially introduced or only slightly introduced with its conical tip into the opening 32.

The expanding webs 52 which are distributed over the circumference around the expanding mandrel 50 have a first section 52a in which their diameter is preferably constant. In a mounted position of the housing 15 on the printed circuit board when the housing 15 has thus been moved up to the surface of the printed circuit board 3, these sections 52a lie within the openings 32 shown in FIG. 11. In particular, in the regions protruding from the opening 32, they have a radial thickened region 52b. Furthermore, on the ends, they can extend slightly conically inwardly, so that they can be guided satisfactorily in the manner of an introduction tip through the respective opening 32.

The placement of the connector 1 in FIGS. 8 and 9 occurs first in a manner analogous to FIGS. 2 and 3. In this position, the expanding webs 52 can protrude through the opening 32 of the printed circuit board 3.

Then, the actuation element is at first moved axially in the opening 32 with the expanding mandrel 50 and the latter is moved downwardly through this opening 32 so that the expanding webs 52 are pressed radially outwardly in the thickened regions 52b. A radial expansion of the expanding webs 52 therefore occurs. Since the entire diameter including the expanding mandrel 50 and the expanding webs 52 in these regions is greater in sections than the diameter of the opening, a kind of expanding peg like an expanding rivet is formed which secures the connector on the conductor on the printed circuit board 3 against unintentional release.

The housing 15 and the single-part or multi-part actuation device 500 are preferably made from a plastic material.

The invention claimed is:

1. An electrical connector for connecting at least one electrical connector to a printed circuit board, comprising
   a) a housing which can be electrically connected on a connection side of the electrical connector to an electrical conductor and including at least one contact on a contact side of the electrical connector for contact with at least one counter-contact on a surface of the printed circuit board;
   b) at least two latching peg assemblies configured to pass through respective openings of the printed circuit board and which are operable between a non-expanded release position having a diameter less than a diameter of the respective opening and an expanded latch position in which the diameter is greater than the diameter of the respective opening; and
   c) at least one actuation device movably connected with said housing to displace said latching peg assembly between its non-expanded release position and said expanded latch position.

2. The electrical connector as defined in claim 1, wherein said contact comprises a compression spring contact.

3. The electrical connector as defined in claim 1, wherein said latching peg assembly includes at least one expandable web and said actuation assembly includes an expanding mandrel.

4. The electrical connector as defined in claim 3, wherein said latching peg assembly comprises a plurality of expanding webs arranged radially outwardly and concentrically relative to said expanding mandrel.

5. The electrical connector as defined in claim 3, wherein said expanding mandrel is arranged on the actuation device and said expanding webs are formed on the housing.

6. The electrical connector as defined in claim 3, wherein said expanding mandrel is arranged on said housing and said expanding webs are arranged on the actuation device.

7. The electrical connector as defined in claim 3, wherein one of said expanding mandrel and said expanding webs has a radial thickened region which is arranged on a side of printed circuit board which faces away from the housing when the connector is mounted on the circuit board.

8. The electrical connector as defined in claim 7, when the connector is mounted on the circuit board, the expanding webs and expanding mandrel collectively have a greater diameter than the respective opening, said expanding webs being arranged adjacent to said expanding mandrel in said expanded latched position.

9. The electrical connector as defined in claim 3, wherein said expanding mandrel has one of a round, angular, and polygonal cross section, said expanding webs being arranged around said expanding mandrel.

10. The electrical connector as defined in claim 1, wherein said housing and said actuation device include a guide assembly which enables said actuation device to shift relative to said housing in a latching direction and an opposite release direction.

11. The electrical connector as defined in claim 1, wherein said housing includes a plurality of said actuation devices.

12. The electrical connector as defined in claim 11, wherein at least one of said actuation devices is provided on said housing and is centrally arranged between a pair of said contacts.

13. The electrical connector as defined in claim 1, wherein said contacts comprise one of pin, blade, and socket contacts.

14. An assembly including a printed circuit board and an electrical connector as defined in claim 1.

15. A method for connecting an electrical connector as defined in claim 1 with a printed circuit board, comprising the steps of
   a) placing the electrical connector on the printed circuit board, said contacts of the connector comprising compression spring contacts which upon application of a contact actuation force contact the counter-contacts of the printed circuit board, said latching peg assembly being guided through a corresponding opening of the printed circuit board;
   b) moving said actuation element relative to said housing into a latching position wherein said expanding webs are moved into said expanded latch position.

\* \* \* \* \*